United States Patent
Stevenson et al.

[11] Patent Number: 6,159,560
[45] Date of Patent: Dec. 12, 2000

[54] PROCESS FOR DEPOSITING A METAL COATING ON A METALLIC COMPONENT OF AN ELECTRICAL STRUCTURE

[76] Inventors: Robert A. Stevenson, 15349 Iron Canyon Rd., Canyon Country, Calif. 91351; Theo C. M. Rijsdijk, E.M.T.A., B.V., Boylerweg 12, 8392NH Boyl, Netherlands

[21] Appl. No.: 09/448,797

[22] Filed: Nov. 24, 1999

Related U.S. Application Data

[60] Provisional application No. 60/109,944, Nov. 25, 1998.

[51] Int. Cl.$^7$ .................................................. C23C 16/00
[52] U.S. Cl. ........................ 427/594; 427/2.1; 427/118; 427/125; 427/399; 427/432; 427/434.6; 427/436; 427/443.2; 427/580
[58] Field of Search ............................. 427/2.1, 118, 125, 427/399, 432, 434.6, 436, 443.2, 580, 594

[56] References Cited

U.S. PATENT DOCUMENTS

| | | |
|---|---|---|
| 1,180,614 | 4/1916 | Simpson . |
| 3,304,362 | 2/1967 | August . |
| 3,844,921 | 10/1974 | Benedict . |
| 4,015,175 | 3/1977 | Kendall et al. . |
| 4,424,551 | 1/1984 | Stevenson et al. . |
| 4,683,516 | 7/1987 | Miller . |
| 4,793,391 | 12/1988 | Linnell et al. . |
| 5,104,755 | 4/1992 | Taylor et al. . |
| 5,333,095 | 7/1994 | Stevenson et al. . |
| 5,406,444 | 4/1995 | Selfried et al. . |
| 5,531,003 | 7/1996 | Seifried et al. . |

*Primary Examiner*—Bernard Pianalto
*Attorney, Agent, or Firm*—Kelly Bauersfeld Lowry & Kelley, LLP

[57] ABSTRACT

A process is provided for depositing a silver coating on a metallic component of a feedthrough assembly to displace surface oxide and to deposit a conductive finish suitable for making an electrical connection. The feedthrough assembly includes a ferrule, an insulator mounted within the ferrule, and at least one tantalum terminal pin extending through the insulator. An inert gas dispensing hood is positioned over the terminal pin to create an argon gas environment around the terminal pin to prevent oxidation. A ground electrode of an electric circuit is connected to the feedthrough assembly. The electric circuit includes a direct current power source electrically connected to a resistor and a high energy storage capacitor. An active electrode of the electrical circuit is attached to a silver anode. The silver anode is brought into contact with a selected area of the terminal pin or ferrule to cause a portion of the silver anode to be deposited onto the contacted area while removing surface oxides from the contacted area. Areas which are not to be coated are shielded from contact with the silver anode using a paper mask.

30 Claims, 4 Drawing Sheets

PROCESS FOR DEPOSITING A METAL COATING ON A METALLIC COMPONENT OF AN ELECTRICAL STRUCTURE

RELATED APPLICATION

This application claims priority from provisional application Serial No. 60/109,944, filed Nov. 25, 1998.

BACKGROUND OF THE INVENTION

This invention relates to electrical feedthroughs of improved design and to their method of fabrication. More particularly, the present invention relates to a process for depositing a protective metal coating over components of feedthroughs which are susceptible to oxidation.

Electrical feedthroughs serve the purpose of providing an electrical circuit path extending from the interior of a hermetically sealed container to an external point outside the container. For example, in implantable medical devices, such as implantable pulse generators (IPG's) including heart pacemakers or defibrillators and the like, the feedthrough assembly comprises one or more conductive terminal pins supported by a hermetic insulator structure for conductive feedthrough passage from the exterior to the interior of the medical device. Many such feedthroughs are known in the art which provide the electrical path and seal the electrical container from its ambient environment. Such feedthrough assemblies typically include a ferrule, the terminal conductor pin(s) or lead(s), and a hermetic glass or ceramic seal which supports the pin within the ferrule. It has recently been discovered that such electrical devices can, under some circumstances, be susceptible to electromagnetic interference (EMI). For example, EMI can inhibit pacing in an IPG. Devices have been developed, including the device of U.S. Pat. No. 5,333,095 to Stevenson et al. (the contents of which are hereby incorporated by reference), which have addressed this problem by incorporating a coaxial capacitor structure within the feedthrough assembly to shunt any undesirable EMI at the entrance of the IPG at high frequencies.

One of the more popular (and least expensive) materials for use as a medical implant terminal pin is tantalum, as it is one of a relatively few pin materials which is both highly conductive and biocompatible (other such pin materials include niobium and platinum). Unfortunately, tantalum is susceptible to oxide growth which can, depending on its extent, act as an insulator instead of a conductor over the surface of the pin. During fabrication of a feedthrough/capacitor combination, the tantalum pin is subjected to one or more heat treatments which can encourage oxidation, affecting the conductivity of the tantalum pin and its ability to make good electrical connections between other elements including the coaxial feedthrough capacitor and so forth.

Attempts have been made to coat the terminal pins with a conductive protective coating to prevent or discourage oxidation. One such method is described in U.S. Pat. No. 5,406,444 to Seifried et al. (the contents of which are hereby incorporated by reference). The Seifried '444 patent discloses a method of coating the terminal pins by vacuum depositing a metal coat by sputtered coating. This is preferably done before the terminal pins are encased in the glass insulator as a more elaborate sputtering fixturing technique is required after the terminal pins are sealed in glass.

There remains, however, a need for a process for applying a protective coating on terminal pins and other conductive components of assembled feedthrough assemblies, which does not require vacuum depositing nor elaborate sputtering techniques. The present invention fulfills this need and provides other related advantages.

SUMMARY OF THE INVENTION

The present invention resides in a process for depositing a metal coating on a selected component of an electrical structure to displace surface oxides and to deposit a conductive finish suitable for making an electrical connection. The process does not require vacuum depositing nor sputtering techniques.

In a preferred form, the process comprises the steps of placing the selected component in an inert gas environment. A ground electrode of an electric circuit is connected to the electrical structure. An active electrode of the electric circuit is attached to a metal anode. The metal anode is brought into contact with a selected area of the selected component to cause a portion of the metal anode to be deposited onto the contacted area of the selected component while removing surface oxides from the contacted area.

The electric circuit includes a direct current power source, to a resistor, and a high energy storage capacitor. The metal anode is preferably comprised of silver, although other appropriate materials can also be used as the metal anode. The process is performed in an inert gas environment, preferably argon, by positioning an inert gas dispensing hood over the selected component to create an inert gas cloud around the selected component. The inert gas is used to prevent further oxidation during the coating process. The hood includes flexible tubing into which is inserted at least a portion of the selected component.

Areas of the electrical structure which are not to be coated are shielded from contact with the metal anode. This is accomplished using a paper mask. The electrical structure may be comprised of a feedthrough assembly including a ferrule, an insulator mounted within the ferrule, and at least one terminal pin extending through the insulator. The selected component may be a metallic terminal pin comprised of tantalum, niobium, platinum or platinum-iridium. The selected component may also be a portion of a ferrule.

Other features and advantages of the present invention will become apparent from the following more detailed description, taken in conjunction with the accompanying drawings which illustrate, by way of example, the principles of the invention.

BRIEF DESCRIPTION OF THE DRAWINGS

The accompanying drawings illustrate the invention. In such drawings.

DETAILED DESCRIPTION OF THE PREFERRED EMBODIMENTS

Figure 1:
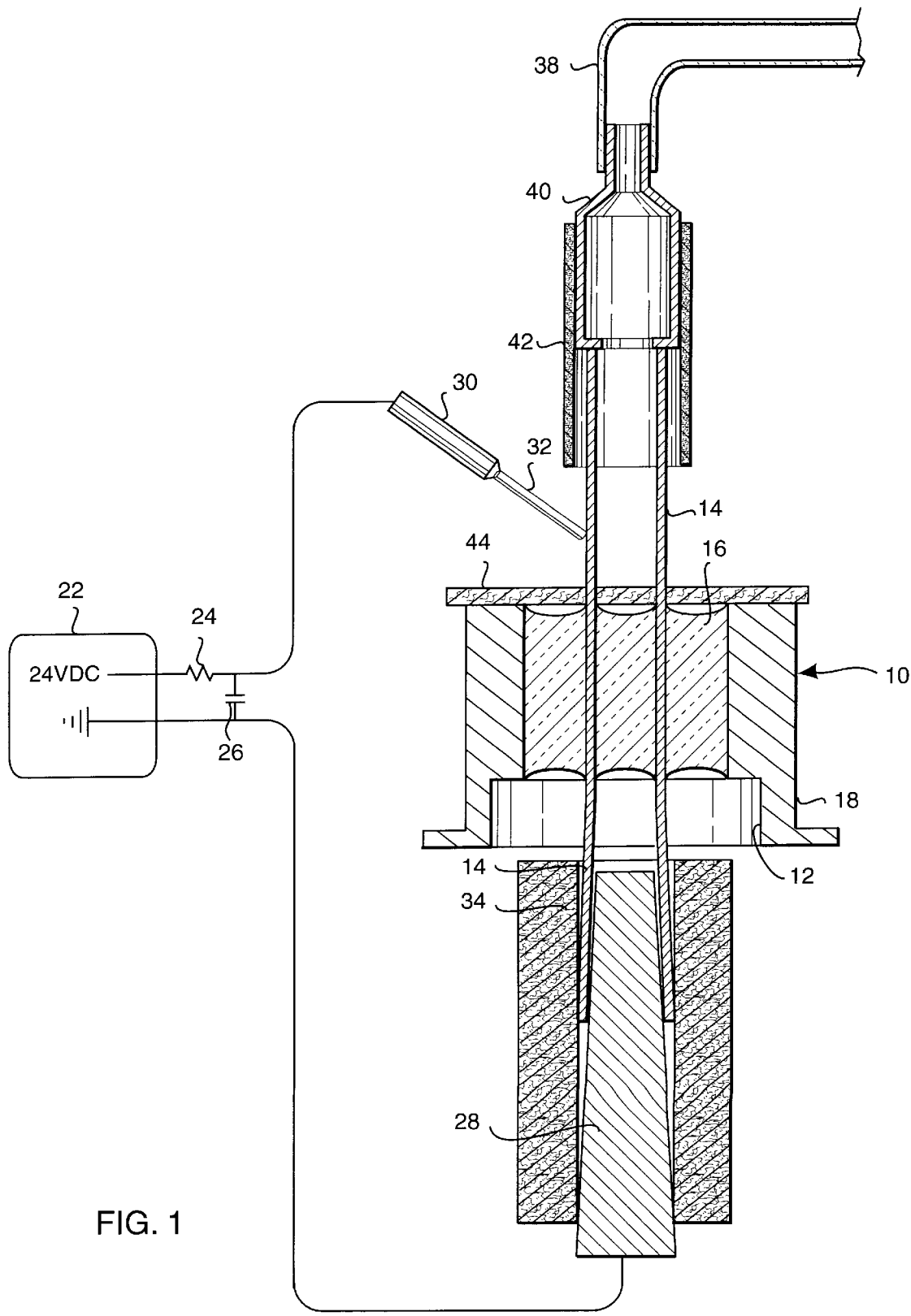
FIG. 1 is a cross-sectional view of a feedthrough assembly having terminal pins placed within a gas hood at one end, and in contact with a ground electrode at the other end, and a schematic representation of an electrical circuit which provides a current to a metal anode that is used to coat the terminal pins.

As shown in the drawings for purposes of illustration, the present invention involves a process for displacing surface oxides and depositing a conductive coating onto conductive components of a feedthrough assembly. The process can be used on a number of various feedthrough assembly designs, but is particularly adapted for use with feedthrough filter capacitor assemblies, such as those found in U.S. Pat. No. 5,333,095. Several feedthrough assembly designs are illustrated in the accompanying drawings for exemplary purposes and each is referred to generally by the reference number 10. Where applicable, similar structures will be given the same reference numbers throughout the drawings.

Electrical feedthroughs typically include a metal ferrule 12, which may be of titanium alloy for use in implantable devices. One or more conductive terminal pins 14 extend through the ferrule 12 in non-conductive relation, and are positioned within the ferrule by an insulator 16. In medical implant applications the pins 14 are often comprised of tantalum, niobium, platinum or platinum-iridium. The ferrule 12 is typically conductively connected to a casing 18, as by welding. A capacitive structure 20 may also be associated with the ferrule 12, either within the casing 18 or the ferrule 12 itself. The varying designs and uses of feedthrough assemblies 10 are well known in the art.

As described above, tantalum terminal pins 14 are susceptible to oxidation. This is particularly the case near the base of a terminal pin 14 where it extends through either the casing 18 or the ferrule 12. Previous methods of applying a conductive, oxidation resistant coating near the terminal pin bases of assembled feedthrough assemblies 10 have been lacking. However, the process of the present invention permits any exposed portion of the terminal pins 14 to be coated, and even allows for other areas of the feedthrough assembly 10 to be conductively coated while shielding other areas which are not to be coated.

With reference to FIG. 1, an electrical circuit is provided which has a 24 volt direct current supply 22, a resistor 24 and a capacitor 26 as shown. Typically, a 250 uF capacitor 26 is loaded up to 24 VDC by use of the direct current power supply 22. The loading current of the capacitor 26 is limited by the resistor 24, preferably having a value of 24 Ohms. Conductive leads extend to a ground electrode 28 and an active electrode 30 which is in the form of a clip. The clip electrode 30 is connected to a metal anode 32, usually comprised of silver, although other metals which are suitable for the process may be used. Silver is the preferred metal as it is highly conductive. The resultant silver coating also has excellent properties of making reliable electrical contact with silver epoxy.

The feedthrough assembly 10 is preferably cleaned with chemical grade acetone and subjected to ultrasound for approximately 1 minute. If discoloration deposits develop due to the evaporation of acetone during the cleaning step, these deposits are removed with pressurized air, typically on the order of 8 bar.

One end of the terminal pins 14 are inserted into a silicon tube 34 which acts as to hold the feedthrough assembly 10 and prevent bending or other damage to the terminal pins 14. The ground electrode 28 is preferably tapered so as to fit between the terminal pins 14 and, as it is moved upwardly as shown in FIG. 1, conductively contact the pins 14. The silicon tube 34 may be hand-held during the process of the invention.

To eliminate further oxidation of that portion of the feedthrough 10 to which a conductive finish is to be applied, an inert gas environment is needed. For this purpose an argon gas flows through a hood 36 and is directed along the tantalum terminal pins 14 and adjacent components which may be subjected to the coating process. The rate of the inert gas flow is preferably one liter per minute. The hood 36 includes a thin tube 38, typically comprised of Teflon, through which the argon gas flows. The Teflon tube 38 is connected to a rigid fixture 40. A rugged silicon tube 42 extends over the fixture 40 to a distance adequate to accept the terminal pins 14. Notably, the silicon tube 42 does not extend over the entire length of the terminal pins 14, but just enough to hold and protect the terminal pins 14 from bending or other damage. Alternatively, the feedthrough assembly 10 may be placed in an inert gas cabinet (not shown) back-filled with argon gas. Using this method, the worker handles the feedthrough assembly 10 with rubber gloves formed integrally with the cabinet.

The capacitor 26 is discharged by making electrical contact between the silver anode 32 and a terminal pin 14, usually by striking or rubbing the silver anode 32 on the surface of the terminal pin 14 in a traditional welding-like motion. When the electrical contact occurs, a high current flows through the silver anode 32 and the terminal pin 14. The high current dissipates heat in the contact area by the formula $I^2r$, in which "I" is the discharging current of the capacitor and "r" is the electrical resistance of the electrical contact area between the silver anode 32 and the terminal pin 14. The generated heat will partly melt and vaporize both the tantalum of the terminal pin 14 and the silver anode 32, causing the silver to diffuse into and be deposited onto the terminal pin 14. Surface oxidation is also removed. The coating is continued by contacting the silver anode 32 to the terminal pin 14 until the predetermined area of the terminal pin 14 is properly coated with silver.

To protect components and areas which are not intended to be coated, such as the glass insulator 16, a shielding mask 44 is placed over these components. In the case of the glass insulator 16, a paper mask in the form of a disc having apertures through which the terminal pins 14 are inserted is used.

Figure 2:
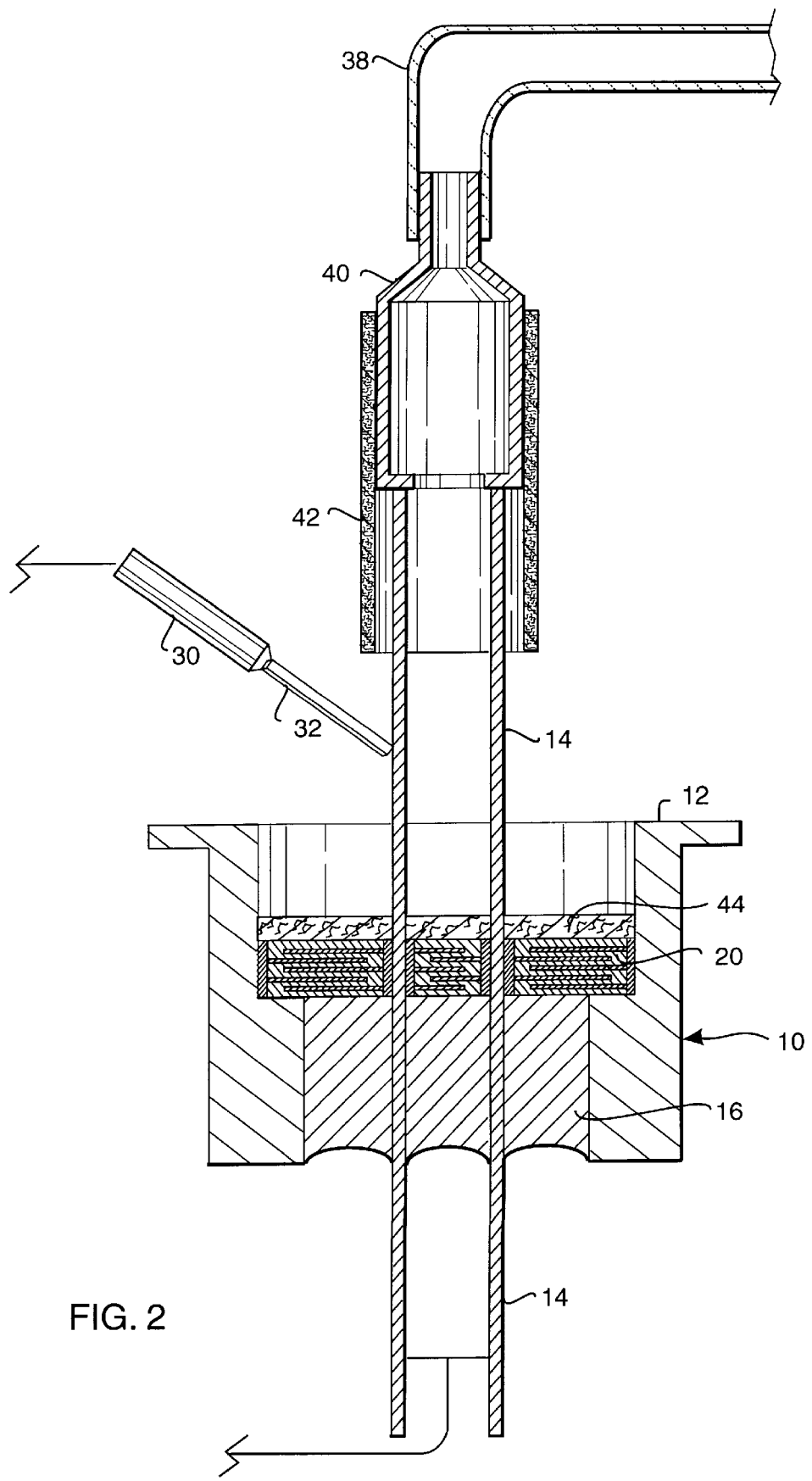
FIG. 2 is a cross-sectional view of the feedthrough assembly of FIG. 1, illustrating the process for coating an opposite end of the terminal pins extending through a ferrule of the feedthrough assembly.

The opposite ends of the terminal pins 14 may also be coated using the same process, as illustrated in FIG. 2. By contacting only the terminal pin 14 and not the ferrule 12 or other components, the terminal pin 14 may be coated within the recessed cavity of the ferrule 12. Using the process of the present invention, even the base of the terminal pin 14 adjacent the ferrule 12 or casing 18 may be coated. Of course, the electrical circuit described above must be in place with a ground electrode 28 in contact with the battery 22. Further, FIG. 2 illustrates a feedthrough filter capacitor 20 in place within a recess of the ferrule 12, and placement of the paper disc 44 over the capacitor to prevent it from being accidentally coated with silver.

After the desired areas of the terminal pins 14 are coated, the feedthrough assembly 10 is removed from the argon gas environment, the shielding mask is removed 44 and the feedthrough assembly 10 is cleaned of any dust or loose parts by pressurized air, e.g. 8 bar. The feedthrough assembly may then be washed in acetone and dried.

When the ferrule 12 of the feedthrough assembly is visible and accessible to the silver electrode 32, such as the feedthrough filter capacitor assembly of the '095 patent, the ferrule 12 may also be inspected and coated with the process of the present invention. The ferrule 12 is oftentimes comprised of titanium which is a difficult material to work with as it readily forms electrically insulative oxides at elevated temperatures (such as the temperature at which polyimide is cured (300° C.) or of typical laser welding operations (500° to 600° C.)). These oxides of titanium are mechanically very tough, hard to remove and very stable (for example, titanium oxides are used as paint pigments). Treatment of a capacitor OD bonding area (footprint) on top of the titanium ferrule 12 guarantees a reliable long term electrical connection which will remain oxide free. As with the tantalum pin 14, the inventive process will also "burn" away any oxide which is already present.

Figure 3:
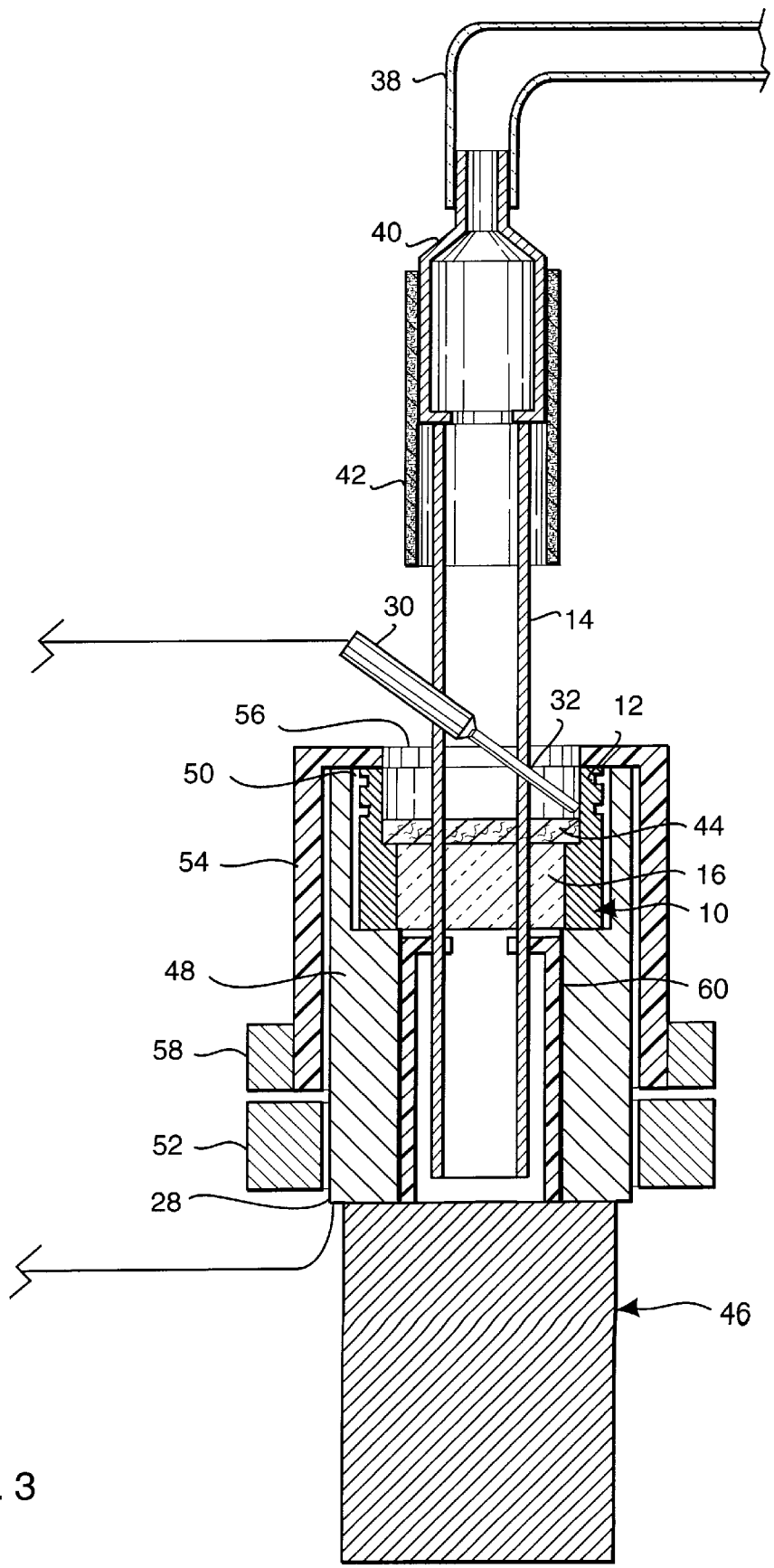
FIG. 3 is a cross-sectional view of another feedthrough assembly having an inner surface of the ferrule coated with a conductive layer in accordance with the invention.

Referring to FIG. 3, the same electrical circuitry is used to perform the process as described above. However, the feedthrough assembly 10 is placed in a holder 46 having a conductive block 48 with a recess 50 configured to accept the feedthrough assembly 10. An electrically insulative cap 54 having an aperture 56 which aligns with the block recess 50 is placed over the feedthrough assembly 10 and block 48 to hold the feedthrough assembly 10 within the recess 50. A ring magnet 58 is attached to the cap 54 near its base so as to be magnetically attracted to the block magnet 52 and securely hold the cap 54 and the feedthrough assembly 10 in place. Abutting surfaces of the ferrule 12 and the block 48 conductively couple the ferrule to the ground of the battery 22.

More particularly, the ground electrode 28 of the electrical circuit is connected to the conductive block 48. An insulative sleeve 60 is fitted within the block recess 50 to insulate the terminal pins 14 from the conductive block 48 and thus the electrical circuit. A paper mask 44 is placed over the glass insulator 16 or capacitor 20. The ferrule 12 is placed in an argon gas environment and coated with silver by contacting the silver electrode 32 with the surface of the ferrule 12 once the circuit is energized, as explained above. The holder 46 may be hand-held and placed under a microscope, such as a 15 power stereo microscope, and a cold light source may be used to illuminate the working area.

Figure 4:
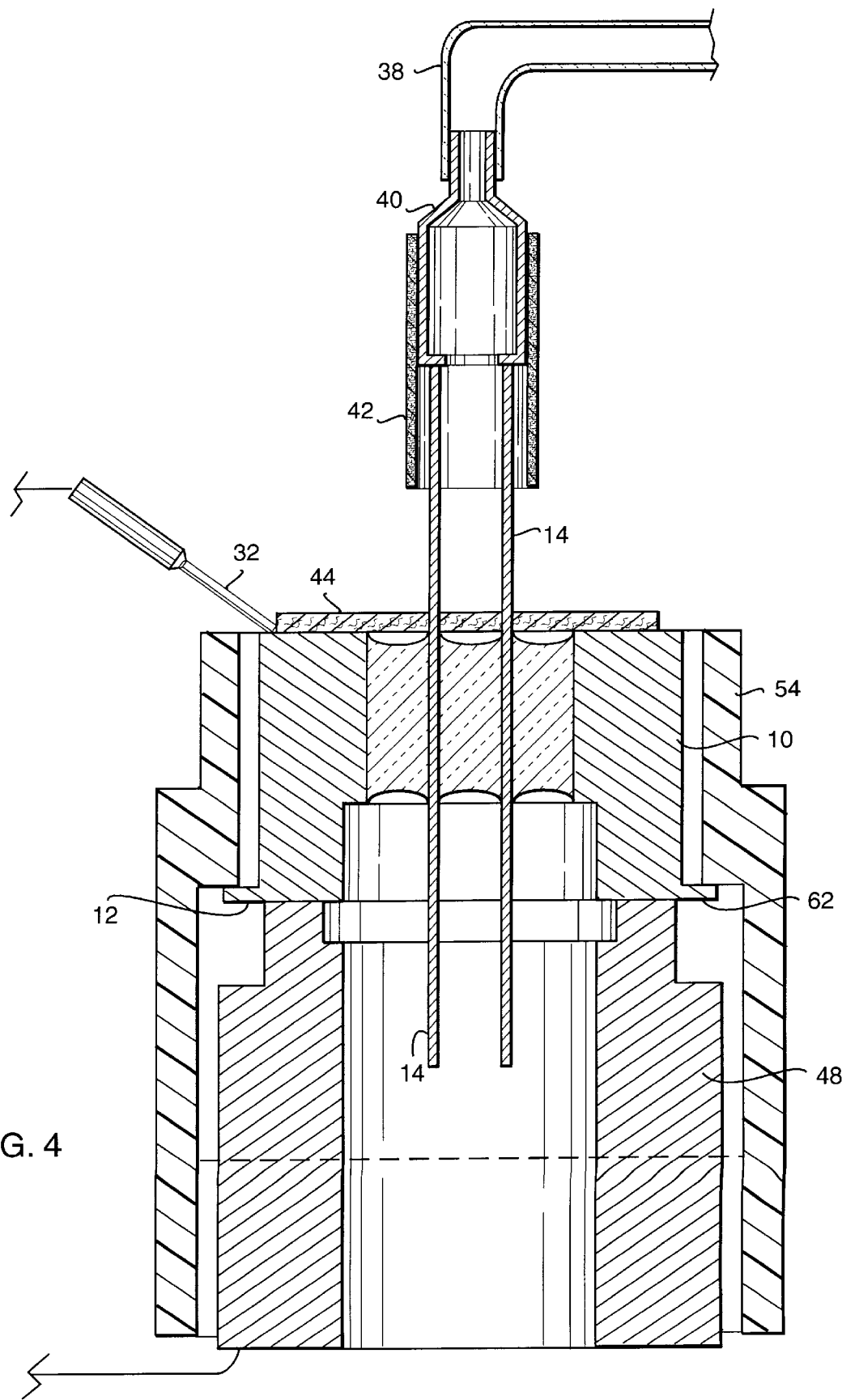
FIG. 4 is a cross-sectional view of the feedthrough assembly illustrating the process for coating an outer surface of the ferrule.

As shown in FIG. 4, an electrically insulative cap 54 and a conductive block 48 are also used for coating the ferrule 12. The feedthrough assembly 10 will typically have a flange 62 which can be engaged with the cap 54 to hold the feedthrough assembly 10 onto the conductive block 48 which is configured to receive the feedthrough assembly 10. As before, a mask 44 is placed over the areas not to be coated (e.g. the glass insulator 16), the ground of the electrical circuit is connected to the block 48, argon gas is supplied, and the area to be treated is contacted with the silver anode 32.

Although the process of the present invention is particularly adapted for use on feedthrough filter capacitor assemblies as described in the '095 patent, the process can be used with a wide range of feedthrough assemblies which have components and surfaces which are accessible to the silver anode 32 and need to be protected from oxidation.

Although several embodiments have been described in detail for purposes of illustration, various modifications may be made without departing from the scope and spirit of the invention. Accordingly, the invention is not to be limited, except as by the appended claims.

What is claimed is:

1. A process for depositing a metal coating on a selected component of an electrical structure to displace surface oxides and to deposit a conductive finish suitable for making an electrical connection, comprising the steps of:

placing the selected component of the electrical structure in an inert gas environment;

connecting a ground electrode of an electric circuit to the electrical structure;

attaching an active electrode of the electric circuit to a metal anode; and bringing the metal anode into contact with a selected area of the selected component to cause a portion of the metal anode to be deposited onto the contacted area of the selected component while removing surface oxides from the contacted area.

2. The process of claim 1, wherein the electrical structure comprises a feedthrough assembly including a ferrule, an insulator mounted within the ferrule, and at least one terminal pin extending through the insulator.

3. The process of claim 2, wherein the placing step comprises placing a metallic terminal pin within the inert gas environment.

4. The process of claim 3, wherein the placing step comprises placing a portion of the ferrule associated with the terminal pin in the inert gas environment.

5. The process of claim 2, wherein the placing step comprises placing the ferrule within the inert gas environment.

6. The process of claim 1, wherein the selected component is platinum-iridium.

7. The process of claim 1, wherein the inert gas is argon.

8. The process of claim 1, wherein the metal anode comprises a silver anode.

9. The process of claim 1, including the step of shielding an area of the electrical structure from contact with the metal anode.

10. The process of claim 9, wherein the shielding step includes use of a physical and electrically insulative mask.

11. The process of claim 1, wherein the electric circuit includes a direct current power source electrically connected to a resistor and a high energy storage capacitor.

12. The process of claim 1, wherein the selected component is tantalum.

13. The process of claim 1, wherein the selected component is niobium.

14. The process of claim 1, wherein the selected component is platinum.

15. The process of claim 1, wherein the placing step includes the step of positioning an inert gas dispensing hood over the selected component to create an inert gas environment around the selected component.

16. The process of claim 15, wherein the hood includes flexible tubing into which is inserted at least a portion of the selected component.

17. A process for depositing a metal coating on a selected component of a feedthrough assembly including a ferrule, an insulator mounted within the ferrule, and at least one terminal pin extending through the insulator, to displace surface oxides and to deposit a conductive finish suitable for making an electrical connection, comprising the steps of:

positioning an inert gas dispensing hood over the selected component to create an inert gas environment around the selected component;

connecting a ground electrode of an electric circuit to the selected component;

attaching an active electrode of the electric circuit to a metal anode;

bringing the metal anode into contact with a selected area of the selected component to cause a portion of the metal anode to be deposited onto the contacted area of the selected component while removing surface oxides from the contacted area; and shielding an area of the feedthrough assembly from contact with the metal anode.

18. The process of claim 17, wherein the positioning step comprises placing a metallic terminal pin in the inert gas environment.

19. The process of claim 18, wherein the hood includes flexible tubing into which is inserted at least a portion of the metallic terminal pin.

20. The process of claim 19, wherein the inert gas is argon and the metal anode comprises a silver anode.

21. The process of claim 18, wherein the metallic terminal pin is tantalum.

22. The process of claim 18, wherein the metallic terminal pin is niobium.

23. The process of claim 18, wherein the metallic terminal pin is platinum.

24. The process of claim 18, wherein the metallic terminal pin is platinum-iridium.

25. The process of claim 17, wherein the selected component comprises the ferrule.

26. The process of claim 17, wherein the shielding step includes use of a physically and electrically insulative mask.

27. The process of claim 17, wherein the electric circuit includes a direct current power source electrically connected to a resistor and a high energy storage capacitor.

28. A process for depositing a silver coating on a tantalum terminal pin of an electrical structure to displace surface oxides and to deposit a conductive finish suitable for making an electrical connection, comprising the steps of:

positioning an inert gas dispensing hood over the tantalum terminal pin to create an argon gas environment around the terminal pin;

connecting a ground electrode of an electric circuit to the electrical structure;

attaching an active electrode of the electric circuit to silver anode;

bringing the silver anode into contact with a selected area of the terminal pin to cause a portion of the silver anode to be deposited onto the contacted area of the terminal pin while removing surface oxides from the contacted area; and shielding an area of the electrical structure from contact with the silver anode using a paper mask.

29. The process of claim 28, wherein the electric circuit includes a direct current power source electrically connected to a resistor and a high energy storage capacitor.

30. The process of claim 29, wherein the electrical structure comprises a feedthrough assembly including a ferrule, an insulator mounted within the ferrule, and at least one terminal pin extending through the insulator.

* * * * *